(12) United States Patent  (10) Patent No.: US 7,473,642 B2
Chiu et al.  (45) Date of Patent: Jan. 6, 2009

(54) METHOD FOR FABRICATING CONDUCTIVE LAYER

(75) Inventors: Hsien-Kun Chiu, Taoyuan County (TW); Chin-Chuan Lai, Taoyuan County (TW); Yi-Pen Lin, Taoyuan County (TW); Shu-Chen Yang, Tainan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 11/761,374

(22) Filed: Jun. 12, 2007

(65) Prior Publication Data

US 2008/0233739 A1 Sep. 25, 2008

(30) Foreign Application Priority Data

Mar. 21, 2007 (TW) .............................. 96109701 A

(51) Int. Cl.
*H01L 21/44* (2006.01)

(52) U.S. Cl. .................. 438/678; 438/613; 438/679; 257/762; 257/443; 257/750; 257/766; 349/38; 349/43

(58) Field of Classification Search .................. 438/613, 438/678, 679; 257/763, 443, 750, 766; 349/38, 349/43

See application file for complete search history.

(56) References Cited

U.S. PATENT DOCUMENTS 6,319,741 B1 11/2001 Izumi et al.
6,770,978 B2 * 8/2004 Izumi et al. .................. 257/762
6,798,032 B2 9/2004 Izumi et al.

* cited by examiner

*Primary Examiner*—George Fourson
*Assistant Examiner*—John M Parker
(74) *Attorney, Agent, or Firm*—Jianq Chyun IP Office

(57) ABSTRACT

A method for fabricating a conductive layer is provided. First, a substrate is provided and a patterned adhesion layer is formed on the substrate. Next, a chemical plating process is performed to form a first metal layer on the patterned adhesion layer by placing the substrate in an electroplating solution and the electroplating solution is shocked. Thereafter, a second metal layer is formed on the first metal layer by performing a plating process.

9 Claims, 2 Drawing Sheets

METHOD FOR FABRICATING CONDUCTIVE LAYER

CROSS-REFERENCE TO RELATED APPLICATION

This application claims the priority benefit of Taiwan application serial no. 96109701, filed on Mar. 21, 2007. All disclosure of the Taiwan application is incorporated herein by reference.

BACKGROUND OF THE INVENTION

1. Field of the Invention

The present invention relates to a method for fabricating a conductive layer, and more particularly, to a method for fabricating a conductive layer in a liquid crystal display.

2. Description of Related Art

Nowadays, multimedia technology has been well developed, which is due to the development of semiconductor devices and display apparatuses. As for displays, liquid crystal displays (LCDs) having advantages such as high image display quality, good space utilization, low power consumption and no radiation have gradually become the mainstream products of the market. In general, a liquid crystal display (LCD) mainly includes a thin film transistor TFT) array substrate, a color filter substrate, and a liquid crystal layer sandwiched between the two substrates. Herein, a thin film transistor array is formed by a plurality of thin film transistors and other related peripheral circuits. In practice, the gate, the source, the drain and the peripheral circuits in a thin film transistor are formed by patterning metal materials.

For example, in a thin film transistor array substrate, the gate and the scan line in a thin film transistor are formed by the same patterning process. Prior to the formation of the gate and the scan line, a metal layer is formed on a substrate by a physical vapor deposition (PVD) process. Next, a patterning process is performed to the metal layer to form the gate and the scan line. The patterning process includes steps such as photoresist coating, exposure, lithography, and etching. Therefore, the overall fabrication process is complicated. Further, due to the related materials such as etchants and photomasks and the equipment required for the fabrication, the manufacturing costs cannot be effectively lowered.

In addition, forming a conductive line of a multi-layer structure requires multiple physical vapor deposition processes and an etching process. A common example is a nickel/copper double-layer structure. Since a physical vapor deposition process requires an expensive vacuum deposition equipment, a suitable etchant must be developed for the etching process. For example, in practice, it is not easy to find a suitable etchant that etches copper and nickel at the same time. Therefore, the costs for developing such an etchant cannot be easily reduced.

SUMMARY OF THE INVENTION

Accordingly, the present invention is directed to a method for fabricating a conductive layer having a good conductivity, and the manufacturing cost thereof is effectively lowered and the production yield is increased.

The present invention is directed to a method for fabricating a conductive layer that is suitable for the fabrication process of the thin film transistor. The method for fabricating a conductive line layer includes the following steps. First, a substrate is provided. Next, a patterned adhesion layer is formed on the substrate. Thereafter, a chemical plating process is performed by placing the substrate in an electroplating solution and a first metal layer is formed on the patterned adhesion layer by shocking the electroplating solution. Afterward, a plating process is performed to form a second metal layer on the first metal layer.

In one embodiment of the present invention, the electrochemistry process may be an electroless plating process.

In one embodiment of the present invention, the plating process may be formed by an electroless plating process or an electroplating process.

In one embodiment of the present invention, the material used for fabricating the first metal layer may include nickel, copper or gold.

In one embodiment of the present invention, the material used for fabricating the second metal layer may include copper.

In one embodiment of the present invention, the method used for forming the patterned adhesion layer includes the following steps. First, a material layer is formed on a substrate. Next, a patterned photoresist layer is formed on the material layer. Thereafter, the material layer is patterned to form a patterned adhesion layer using the patterned photoresist layer as a mask. Afterward, a hard bake process is performed to the patterned photoresist layer and the patterned adhesion layer. In addition, the patterned photoresist layer is removed.

In one embodiment of the present invention, the temperature used for the hard bake process may be between 180° C. and 220° C.

In one embodiment of the present invention, the temperature used for the hard bake process may be 200° C.

In one embodiment of the present invention, the material layer may include palladium compound, acrylic copolymer, and electronic grade propylene glycol monomethyl ether acetate.

In one embodiment of the present invention, the method used for removing the patterned photoresist layer may include a dry photoresist stripping process.

The method used for fabricating the conductive layer of the present invention utilizes an electroplating process such that the etching process is performed less and the manufacturing costs are reduced. Since the method used for fabricating the conductive layer of the present invention utilizes a method that shocks the electroplating solution to prevent the bubbles from sticking onto the substrate during the fabrication process. Therefore, no anti-bubble additive is needed to add into the electroplating solution and the conductive layer has a lower resistance. In addition, the method used for fabricating the conductive layer of the present invention effectively improve the production yield.

In order to make the aforementioned and other objects, features and advantages of the present invention more comprehensible, preferred embodiments accompanied with figures are described in detail below.

DESCRIPTION OF EMBODIMENTS

Figure 1A:
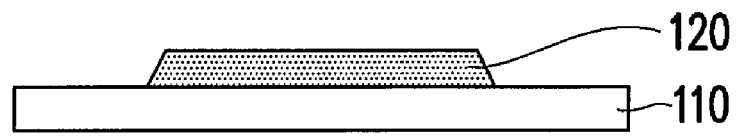
FIG. 1A through FIG. 1C are schematic cross-sectional views illustrating the method for fabricating the conductive layer of the present invention.
Figure 1B:
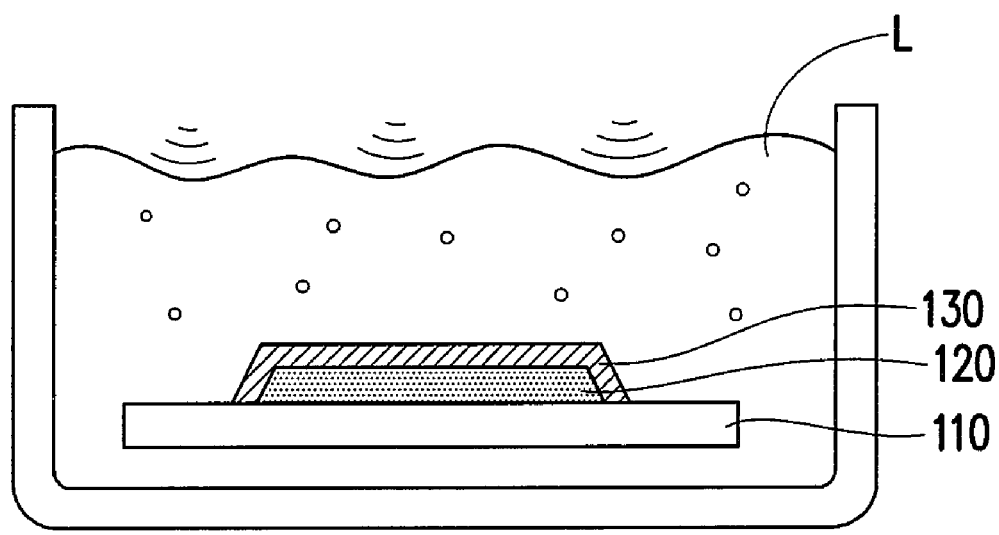
Figure 1C:
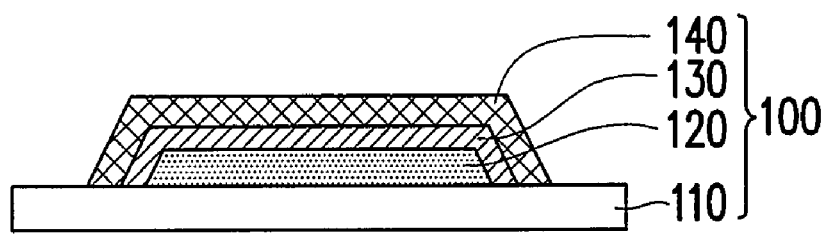

FIG. 1A through FIG. 1C are schematic cross-sectional views illustrating the method for fabricating the conductive layer of the present invention. Please refer to FIG. 1A. First, a substrate 110 is provided. A patterned adhesion layer 120 is formed on the substrate 110. Certainly, anybody skilled in the art can make some modifications and variations to the pattern of the patterned adhesion layer 120 shown in FIG. 1A according to the actual requirement and the present invention is not limited to FIG. 1A.

FIG. 2A through FIG. 2E are schematic cross-sectional views illustrating the method for fabricating the patterned adhesion layer of the present invention. Please refer to FIG. 2A. Specifically, the method used for forming the patterned adhesion layer 120 includes the following steps. First, a material layer 121 is formed on a substrate 110. Generally, the material layer 121 is primarily formed by palladium compound, acrylic copolymer, and electronic grade propylene glycol monomethyl ether acetate.

Figure 2A:
FIG. 2A through FIG. 2E are schematic cross-sectional views illustrating the method for fabricating the patterned adhesion layer of the present invention.
Figure 2B:
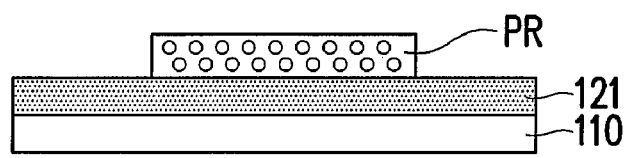

Next, as shown in FIG. 2B, a patterned photoresist layer PR is formed on the substrate 121. Generally, prior to the formation of the patterned photoresist layer PR, a spin coating is performed to completely form a layer of photoresist material onto the material layer 121. Further, the photoresist material may be, for example, positive photoresist. Next, an exposure process is performed to the photoresist material layer through a photomask (not shown) to form the desired pattern on the photoresist material. Certainly, anybody skilled in the art can make some modifications and variations to the pattern of the patterned photoresist layer PR shown in FIG. 2B according to the actual requirement and the present invention is not limited to FIG. 2B.

Figure 2C:
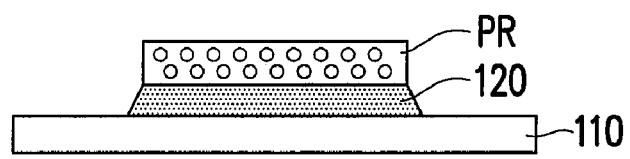

Thereafter, please refer to FIG. 2C. The material layer 121 is patterned to form a patterned adhesion layer 120 using the patterned photoresist layer PR as a mask. Afterward, please refer to FIG. 2D. A hard bake process is performed to the patterned photoresist layer PR and the patterned adhesion layer 120. In practice, the temperature used for the hard bake process is between 180° C. and 220° C. In one embodiment of the present invention, the temperature used for the hard bake process may be set to 200° C., which may vary according to the materials used. Therefore, the hard bake process can effectively increase the cross link of the patterned adhesion layer 120 to firmly attach the patterned adhesion layer 120 to the substrate 110. On the other hand, there are various ways of heating, including heating with an oven, a hot plate, or infrared radiation and the present invention is not limited thereto.

Figure 2D:
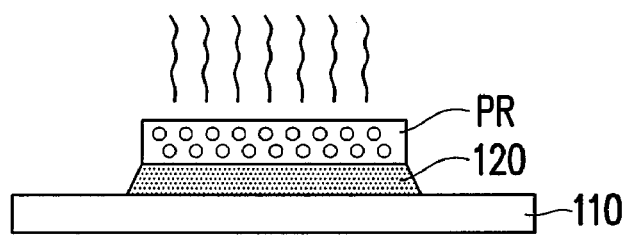
Figure 2E:

Please refer to FIG. 2D. The patterned photoresist layer PR is removed to form the patterned adhesion layer 120. In practice, the method used for removing the patterned photoresist layer may be a dry photoresist stripping process. A dry photoresist stripping process primarily utilizes plasma to remove the patterned photoresist layer PR. Certainly, to prevent the formation of any residual ash after the patterned photoresist layer PR reacted with plasma, a wet photoresist stripping process may be included in the steps for removing the photoresist and the present invention is not limited thereto. The patterned adhesion layer 120 can be formed by following the steps shown in FIG. 2A through FIG. 2D.

Thereafter, please refer to FIG. 1B. A chemical plating process is performed by placing a substrate 110 in an electroplating solution L and a first metal layer 130 is formed on the patterned adhesion layer 120 by shocking the electroplating solution L. In practice, the chemical plating process may be an electroless plating process and the material used for fabricating the first metal layer 130 may be nickel, copper or gold.

It should be noted that usually phosphorous is added during an electroplating process to prevent the formation of bubbles. However, such conductive line results in an increase in the resistance due to the presence of phosphorous. Take nickel conductive line as an example. The resistance of a nickel conductive line including phosphorous is approximately between 50 μΩ/cm and 60μΩ/cm. It should be noted that the present invention prevents bubbles from sticking onto the first metal layer 130 by shocking the electroplating solution L to ensure the first metal layer 130 has a lower resistance. Generally, if nickel is used, the resistance of the first metal layer 130 is approximately between 17.99 μΩ/cm and 23.41 μΩ/cm. It should be noted that the present invention is not limited to any kind of shocking, as long as there is relative motion between the electroplating solution L and the substrate 110. On the other hand, since the resistance of the first metal layer 130 is relatively low, other metal layers can be directly formed on the first metal layer 130 without a prior formation of a gold layer on the first metal layer 130.

Afterward, please refer to FIG. 1C. A plating process is performed to form a second metal layer 140 on the first metal layer 130. In practice, the plating process may be an electroless plating process or an electroplating process and the material used for fabricating the second metal layer 140 is, for example, copper. It should be noted that the conductive layer 100 of the present invention is formed by the patterned adhesion layer 120, the first metal layer 130 and the second metal layer 140.

Further, the conductive layer 100 of the present invention can be used as a peripheral circuit that transmits signal on a liquid crystal display, as well as a metal layer in a thin film transistor such as a gate. Nevertheless, the present invention is not limited thereto. In practice, the material commonly used for fabricating the first metal layer 130 in the conductive layer 100 is nickel and the material commonly used for fabricating the second metal layer is copper. It should be noted that it is not easy to find a suitable etchant to simultaneously etch copper and nickel. Therefore, a precise pattern is not easy to be achieved by the conventional etching process. Comparatively, according to the present invention, the conductive layer 100 is fabricated by forming the first metal layer 130 and the second metal layer 140 by electroplating. Therefore, the conductive layer 100 of the present invention can have a more precise pattern.

On the other hand, when fabricating the conductive layer 100 using the conventional physical vapor deposition process and the etching process, a vacuum deposition equipment is usually used. Generally, a vacuum deposition equipment is more expensive than an electroplating equipment. Therefore, the method used for fabricating the conductive layer 100 of the present invention can effectively reduce the manufacturing costs.

The method used for fabricating the conductive layer of the present invention includes shocking the electroplating solution L to prevent bubbles sticking to the conductive layer during the fabrication process. Therefore, no anti-bubble additive such as phosphorous is needed to add into the electroplating solution such that the conductive layer formed has a lower resistance. Further, the method used for fabricating the conductive layer of the present invention efficiently reduces the numbers of the etching process. Hence, the costs for related materials such as the etchant can be effectively reduced. Since the method used for fabricating the conductive layer of the present invention utilizes an electroplating process, the quantity of the vacuum deposition equipment required and the manufacturing costs are greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a conductive layer suitable for fabrication of thin film transistors, comprising:
   providing a substrate;
   forming a patterned adhesion layer on the substrate, wherein the method for fabricating the patterned adhesion layer comprises:
      forming a material layer on the substrate;
      forming a patterned photoresist layer on the material layer;
      patterning the material layer to form the patterned adhesion layer using the patterned photoresist layer as a mask;
      performing a hard bake process on the patterned photoresist layer and the patterned adhesion layer; and
      removing the patterned photoresist layer;
   performing a chemical plating process by placing the substrate in an electroplating solution to form a first metal layer on the patterned adhesion layer; and
   performing a plating process to form a second metal layer on the first metal layer.

2. The method of claim 1, wherein the chemical plating process is an electroless plating process.

3. The method of claim 1, wherein the plating process is an electroless plating process or an electroplating process.

4. The method of claim 1, wherein the materials used for fabricating the first metal layer comprise nickel, copper, and gold.

5. The method of claim 1, wherein the materials used for fabricating the second metal layer comprise copper.

6. The method of claim 1, wherein the temperature used for the hard bake process is between 180° C. and 220° C.

7. The method of claim 6, wherein the temperature used for the hard bake process is 200° C.

8. The method of claim 1, wherein the material layer comprises palladium compound, acrylic copolymer, and electronic grade propylene glycol monomethyl ether acetate.

9. The method of claim 1, wherein the method used for removing the patterned photoresist layer comprises a dry photoresist stripping process.

* * * * *